United States Patent
Aziz et al.

(10) Patent No.: US 6,740,429 B2
(45) Date of Patent: *May 25, 2004

(54) ORGANIC LIGHT EMITTING DEVICES

(75) Inventors: Hany Aziz, Burlington (CA); Cuong Vong, Hamilton (CA); Nan-Xing Hu, Oakville (CA); Zoran D. Popovic, Mississauga (CA); Ah-Mee Hor, Mississauga (CA)

(73) Assignee: Xerox Corporation, Stamford, CT (US)

( * ) Notice: Subject to any disclaimer, the term of this patent is extended or adjusted under 35 U.S.C. 154(b) by 204 days.

This patent is subject to a terminal disclaimer.

(21) Appl. No.: 10/005,970

(22) Filed: Nov. 8, 2001

(65) Prior Publication Data

US 2003/0104244 A1 Jun. 5, 2003

(51) Int. Cl.⁷ .............................................. H05B 33/12
(52) U.S. Cl. ........................ 428/690; 428/213; 428/332; 428/917; 313/504; 313/506
(58) Field of Search ............................... 428/213, 332, 428/690, 917; 427/66; 313/504, 506

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 5,061,569 A | 10/1991 | VanSlyke et al. | 428/457 |
| 5,141,671 A | 8/1992 | Bryan et al. | 252/301.16 |
| 5,150,006 A | 9/1992 | Van Slyke et al. | 313/504 |
| 5,151,629 A | 9/1992 | VanSlyke et al. | 313/504 |
| 5,227,252 A | 7/1993 | Murayama et al. | 428/690 |
| 5,458,977 A * | 10/1995 | Hosokawa et al. | 428/411.1 |
| 5,516,577 A | 5/1996 | Matsuura et al. | 428/212 |
| 5,601,903 A | 2/1997 | Fujii et al. | 428/212 |
| 5,639,914 A * | 6/1997 | Tomiyama et al. | 564/309 |
| 5,739,635 A | 4/1998 | Wakimoto | 313/504 |
| 5,792,557 A * | 8/1998 | Nakaya et al. | 428/411.1 |
| 5,846,666 A | 12/1998 | Hu et al. | 428/690 |
| 5,853,905 A | 12/1998 | So et al. | 428/690 |
| 5,858,562 A | 1/1999 | Utsugi et al. | 428/690 |
| 5,925,472 A | 7/1999 | Hu et al. | 428/690 |
| 5,925,980 A | 7/1999 | So et al. | 313/504 |
| 5,935,720 A | 8/1999 | Chen et al. | 428/690 |
| 5,942,340 A | 8/1999 | Hu et al. | 428/690 |
| 5,952,115 A | 9/1999 | Hu et al. | 428/690 |
| 6,020,078 A | 2/2000 | Chen et al. | 428/690 |
| 6,048,630 A | 4/2000 | Burrows et al. | 428/690 |
| 6,057,048 A | 5/2000 | Hu et al. | 428/690 |
| 6,114,055 A | 9/2000 | Choong et al. | 428/690 |
| 6,130,001 A | 10/2000 | Shi et al. | 428/690 |
| 6,229,012 B1 | 5/2001 | Hu et al. | 544/180 |
| 2001/0053462 A1 * | 12/2001 | Mishima | 428/690 |
| 2002/0034659 A1 * | 3/2002 | Nishi et al. | 428/690 |

FOREIGN PATENT DOCUMENTS

| | | |
|---|---|---|
| EP | 0 704 912 A | 4/1996 |
| EP | 0 903 964 A1 | 3/1999 |

OTHER PUBLICATIONS

Copending Application Ser. No. 09/357,551, filed Jul. 20, 1999, on "Organic Light Emitting Devices Having Improved Efficiency and Operation Lifetime" by Hany Aziz et al.

Copending Application Ser. No. 09/606,670, filed Jun. 30, 2000, on "Organic Light Emitting Devices Having Improved Performance" by Hany Aziz et al.

Copending Application Ser. No. 09/800,716 on "Cathodes For Electroluminescent Devices Having Improved Contrast and Reduced Dark Spot Growth" by Yoon–Fei Liew et al.

Copending Application Ser. No. 09/770,159, filed Jan. 26, 2001, on "Organic Light Emitting Devices" by Hany Aziz et al.

Copending Application Ser. No. 09/770,154, filed Jan. 26, 2001, on "Electroluminescent Devices" by Hany Aziz et al.

Copending Application Ser. No. 09/935,031, filed Aug. 22, 2001, on "OLEDS Having Light Absorbing Electrode" by Hany Aziz et al.

S.A. Van Slyke et al., "Organic Electroluminescent Devices with Improved Stability", Appl. Phys. Lett. 69, pp. 2160–2162, 1996.

Kido et al., "Organic Electroluminescent Devices Based on Molecularly Doped Polymers", Appl. Phys. Lett. 61, pp. 761–763, 1992.

S. Naka et al., "Organic Electroluminescent Devices Using a Mixed Single Layer," Jpn. J. Appl. Phys. 33, pp. L1772–L1774, 1994.

W. Wen et al., Appl. Phys. Lett. 71, 1302 (1997).

C. Wu et al., "Efficient Organic Electroluminescent Devices Using Single–Layer Doped Polymer Thin Films with Bipolar Carrier Transport Abilities", IEEE Transactions on Electron Devices 44, pp. 1269–1281, 1997.

(List continued on next page.)

Primary Examiner—Cynthia H. Kelly
Assistant Examiner—Dawn Garrett
(74) Attorney, Agent, or Firm—E. D. Palazzo

(57) ABSTRACT

An organic light emitting device containing (i) an anode or a first electrode;

(ii) a hole transport layer containing, for example, a mixture of a porphyrin and a hole transport material (iii) a mixed region containing a mixture of (1) a hole transport material, and (2) an electron transport material;

(iv) a cathode or second electrode, and wherein the organic light emitting device may further contain at least one of (v) an electron transport region interposed between the mixed region and the cathode; and (vi) a thermal protective element coated on one of the anode and cathode.

43 Claims, 1 Drawing Sheet

OTHER PUBLICATIONS

H. Aziz et al., *Science* 283, 1900 (1999).

Z.D. Popovic et al., *Proceedings of the SPIE*, vol. 3176, "Organic Light–Emitting Materials and Devices II", San Diego, CA, Jul. 21–23, 1998, pp. 68 to 73.

Y. Hamada et al., "Influence of the Emission Site on the Running Durability of Organic Electroluminescent Devices", *Jpn. J. Appl. Phys.* 34, pp. L824–826, 1995.

Zhou et al., "Real–Time Observation of Temperature Rise and Thermal Breakdown Processes in Organic Leds Using an IR Imaging And Analysis System", *Advanced Materials* 12, pp 265–269, 2000.

J.R. Sheats et al., "Organic Electroluminescent Devices", *Science* 273, pp. 884–888, 1996.

S. Tokito et al., "High–Temperature Operation of an Electroluminescent Device Fabricated Using a Novel Triphenylamine Derivative", *Appl. Phys. Lett.* 69, 878 (1996).

Kido et al., "White light emitting organic electroluminescent device using lanthanide complexes", *Jpn. J. App. Phys.*, vol. 35, pp. L394–L396 (1996).

Baldo et. al., "Highly efficient organic phosphorescent emission from organic electroluminescent devices", *Letters to Nature*, vol. 395, pp 151–154 (1998).

* cited by examiner

ORGANIC LIGHT EMITTING DEVICES

COPENDING APPLICATIONS AND PATENTS

Illustrated in copending application U.S. Ser. No. 10/005, 930, filed concurrently herewith, the disclosure of which is totally incorporated herein by reference, is an organic light emitting device comprising
  (i) a first electrode;
  (ii) a mixed region comprising a first hole transport material and a first electron transport material;
  (iii) a second electrode;
  (iv) an optional thermal protective layer coated on one of the first and second electrodes, wherein one of said first and second electrodes is a hole injection anode, and one of said electrodes is an electron injection cathode, and wherein the organic light emitting device further comprises at least one of
  (v) a hole transport region interposed between said anode and said mixed region; and wherein said hole transport region is comprised of a second hole transport material, and which material is in contact with the mixed region; and
  (vi) an electron transport region interposed between said cathode and said mixed region, and wherein said region is comprised of a second electron material, and which material is in contact with the mixed region; and containing at least one of
    a. said hole transport region (v) wherein said first hole transport material (ii) is similar to or dissimilar than said second hole transport material (v);
    b. said electron transport region (vi) wherein said first electron transport material (ii) is similar to or dissimilar than said second electron transport material (vi); and wherein when a. is similar, b. is dissimilar; when a. is dissimilar, b. is similar or dissimilar; and when b. is dissimilar, a. is similar or dissimilar.

Illustrated in copending application U.S. Ser. No. 10/005, 404, filed concurrently herewith, the disclosure of which is totally incorporated herein by reference, is an organic light emitting device comprising
  (i) a first electrode;
  (ii) a region comprising a mixture of (1) a tertiary aromatic amine, (2) a metal oxinoid, and (3) a red emitting material represented by

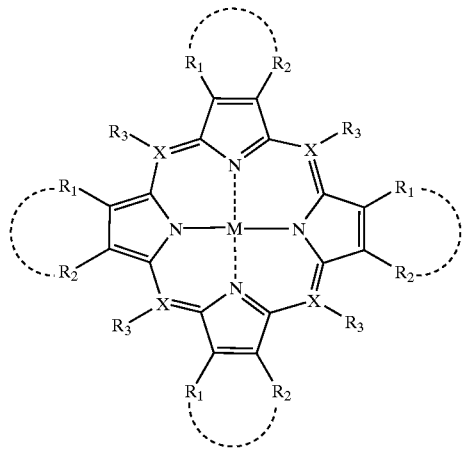

wherein X is a carbon C atom or a nitrogen N atom, or optionally oxygen or sulfur; $R_1$, $R_2$ and $R_3$ are each independently selected from the group consisting of hydrogen, alkyl, substituted alkyl, aryl, and substituted aryl; M is a divalent, trivalent or tetravalent metal;
  (iii) a second electrode;
  (iv) an optional protective element coated on at least one of the first and second electrodes; wherein one of said first and second electrodes is a hole injection anode, and one of said electrodes is an electron injection cathode; and at least one of
  (v) a hole transport region situated between the anode and the region (ii), and wherein the hole transport region optionally includes a buffer layer; and
  (vi) an electron transport region situated between the cathode and the region (ii), and wherein said red emitting component is present in an amount of from 1 to about 40 weight percent based on total weights of components in region (ii).

Illustrated in copending application U.S. Ser. No. 10/005, 518, filed concurrently herewith, the disclosure of which is totally incorporated herein by reference, is an organic light emitting device comprising
  (i) a first electrode;
  (ii) a mixed region comprising a mixture of (1) a tertiary aromatic amine, (2) a metal oxinoid, and (3) a green emitting coumarin dye of the Formula

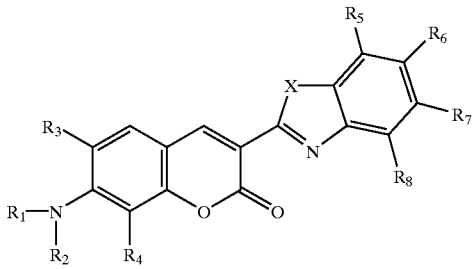

wherein X is selected from the group consisting of an oxygen atom, a sulfur atom, an alkyl imino group and aryl imino group; $R_1$ and $R_2$ are individually selected from the group consisting of alkyl, aryl, and carbocyclic; $R_3$ and $R_4$ are individually selected from the group consisting of a hydrogen atom, alkyl, and optionally a branched or unbranched 5 or 6 member substituent ring connecting with $R_1$ and $R_2$, respectively; and $R_5$, $R_6$, $R_7$, and $R_8$ are individually selected from the group consisting of a hydrogen atom, an alkoxy group and an alkyl group;
  (iii) a second electrode;
  (iv) an optional thermal protective element coated on one of the first and second electrodes; wherein one of the first and second electrodes is a hole injecting anode, and one of the first and second electrodes is an electron injecting cathode, and wherein the organic light emitting device further comprises at least one of
  (v) a hole transport region interposed or situated between the anode and the mixed region, wherein the hole transport region optionally includes a buffer layer; and
  (vi) an electron transport region interposed between the cathode and the mixed region, and wherein said green emitting dye is present in an amount of from about 0.01 to about 10 weight percent based on the total of said mixed layer components (ii).

Illustrated in copending application U.S. Ser. No. 10/005, 993, filed concurrently herewith, the disclosure of which is totally incorporated herein by reference, is an organic light emitting device, comprising (i) a first electrode;

(ii) a region comprising a mixture of (1) N,N'-bis(p-biphenyl)-N,N'-diphenyl benzidine, and (2) an electron transport material, and which region further optionally comprises an organic luminescent material, and wherein said mixed region is capable of emitting light in response to hole-electron recombination;

(iii) a second electrode;

(iv) an optional thermal layer coated on at least one of the first and second electrodes, wherein one of said first and second electrodes is a hole injection anode, and one of said electrodes is an electron injection cathode, and wherein the organic light emitting device further comprises at least one of (v) a hole transport region interposed or situated between the first electrode and the mixed region; and (vi) an electron transport region interposed or situated between the mixed region and the cathode.

Illustrated in copending application U.S. Ser. No. 09/935,031, filed Aug. 22, 2001 on "OLEDs Having Light Absorbing Electrode", U.S. Publication No. 20030038593, the disclosure of which is totally incorporated herein by reference, is an organic light emitting device comprising a first electrode;

a second electrode; and a luminescent region including an organic electroluminescent material between the first electrode and the second electrode, wherein one of the first electrode and the second electrode includes both a substantially transparent charge injecting layer adjacent to the luminescent region and an electrically conductive light absorbing layer.

Illustrated in U.S. Pat. No. 6,392,339 on "Organic Light Emitting Devices Having Improved Efficiency and Operation Lifetime", filed on Jul. 20, 1999, the disclosure of which is totally incorporated herein by reference, is an organic light emitting device, comprising, for example, a mixed region comprising a mixture of a hole transport material and an electron transport material, one of the hole transport material and the electron transport material being an emitter, the mixed region having a first surface and a second surface;

at least one of (i) a hole transport material on the first surface, and (ii) an electron transport material on the second surface;

an anode in contact with the hole transport material on the first surface or with the first surface; and a cathode in contact with the electron transport material on the second surface or with the second surface; and U.S. Pat. No. 6,392,250 on "Organic Light Emitting Devices Having Improved Performance", filed on Jun. 30, 2000, the disclosure of which is totally incorporated herein by reference, is an organic light emitting device, comprising, for example, a mixed region having a first surface and a second surface, the mixed region comprising a mixture of a hole transport material, an electron transport material and at least one dopant, the dopant being an emitter, at least one of the hole transport material and the electron transport material optionally being an emitter;

at least one of (i) a hole transport region on the first surface, and (ii) an electron transport region on the second surface;

an anode in contact with the hole transport region on the first surface or with the first surface; and a cathode in contact with the electron transport region on the second surface or with the second surface.

Illustrated in copending applications U.S. Ser. No. 09/770,159 on "Organic Light Emitting Devices", filed Jan. 26, 2001, U.S. Publication No. 20020135296, the disclosure of which is totally incorporated herein by reference, is an organic light emitting device comprising, for example, in an optional sequence (i) a substrate;

(ii) a first electrode;

(iii) a mixed region comprising a mixture of a hole transport material and an electron transport material, and wherein this mixed region includes at least one organic luminescent material;

(iv) a second electrode;

(v) a thermal protective element coated on the second electrode, wherein one of the two said first and second electrodes is a hole injection anode, and one of the two said electrodes is an electron injection cathode, and wherein the organic light emitting device further comprises;

(vi) a hole transport region, interposed between the anode and the mixed region, wherein the hole transport region optionally includes a buffer layer; and (vii) an electron transport region interposed between the second electrode and the mixed region; and in U.S. Ser. No. 09/770,154 on "Electroluminescent Devices", filed on Jan. 26, 2001, U.S. Publication No. 20020145380, the disclosure of which is totally incorporated herein by reference, is disclosed an organic light emitting device comprising in sequence a substrate;

a first electrode;

a light emitting region comprising an organic luminescent material; and a second electrode, and a thermal protective element.

Illustrated in copending application U.S. Ser. No. 09/800,716, now abandoned, on "Cathodes For Electroluminescent Devices Having Improved Contrast and Reduced Dark Spot Growth", filed on Mar. 8, 2001, the disclosure of which is totally incorporated herein by reference, is an electroluminescent device, comprising:

a first electrode;

a second electrode; and a luminescent region between the first electrode and the second electrode, wherein one of the first electrode and the second electrode comprises a metal-organic mixed region including:

a metal;

an organic material; and at least one component selected from the group consisting of metals, organic materials and inorganic materials.

The appropriate components and processes of the above copending applications may be selected for embodiments of the present invention in embodiments thereof.

BACKGROUND

This invention relates to optoelectronic devices, and more particularly, to organic light emitting devices (organic EL devices). More specifically, the present invention relates to substantially stable organic EL devices which have relatively long operational lifetime, such as at least about 1,000 hours before their luminance drops to some percent of its initial value, such as about 50 percent of the initial luminance, and which devices are substantially stable at high temperatures, such as from about 70° C. to about 100° C.

REFERENCES

An organic electroluminescent (EL) device can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent layer and undergo recombination to form excitonic states which subsequently emit light. A number of organic EL devices have been prepared from a laminate of an organic luminescent material and electrodes of opposite polarity, which devices include a single crystal material, such as single crystal anthracene as the luminescent substance as described, for example, in U.S. Pat. No. 3,530,325, the disclosure of which is totally incorporated herein by reference. These types of devices are believed to require excitation voltages on the order of 100 volts or greater.

An organic EL device with a multilayer structure can be formed as a dual layer structure comprising one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507; 4,720,432, and 4,769,292, the disclosures of which are totally incorporated herein by reference, wherein U.S. Pat. No. 4,769,292, the disclosure of which is totally incorporated herein by reference, discloses, for example, an organic EL device comprising three separate layers, a hole transport layer, a luminescent layer, and an electron transport layer, which layers are laminated in sequence and are sandwiched between an anode and a cathode, and wherein a fluorescent dopant material is added to the emission zone or layer whereby the recombination of charges results in the excitation of the fluorescent material. In some of these multilayer structures, such as, for example, organic light emitting devices described in U.S. Pat. No. 4,720,432, the disclosure of which is totally incorporated herein by reference, the organic light emitting device further comprises a buffer layer interposed between the hole transport layer and the anode. The combination of the hole transport layer and the buffer layer forms a dual-layer hole transport region, reference S. A. Van Slyke et al., "Organic Electroluminescent Devices with Improved Stability," Appl. Phys. Left. 69, pp. 2160–2162, 1996, the disclosure of which is totally incorporated herein by reference.

There have also been attempts to obtain electroluminescence from organic light emitting devices containing mixed layers, for example, layers in which both the hole transport material and the emitting electron transport material are mixed together in one single layer, see, for example, Kido et al., "Organic Electroluminescent Devices Based On Molecularly Doped Polymers," Appl. Phys. Lett. 61, pp. 761–763, 1992; S. Naka et al., "Organic Electroluminescent Devices Using a Mixed Single Layer," Jpn. J. Appl. Phys. 33, pp. L1772–L1774, 1994; W. Wen et al., Appl. Phys. Lett. 71, 1302 (1997); and C. Wu et al., "Efficient Organic Electroluminescent Devices Using Single-Layer Doped Polymer Thin Films with Bipolar Carrier Transport Abilities", IEEE Transactions on Electron Devices 44, pp. 1269–1281, 1997. In a number of these devices, the electron transport material and the emitting material can be the same or the mixed layer can further comprise an emitting material as a dopant. Other examples of organic light emitting devices which are formed of a single organic layer comprising a hole transport material and an electron transport material can be found, for example, in U.S. Pat. Nos. 5,853,905; 5,925,980; 6,114,055 and 6,130,001, the disclosures of which are totally incorporated herein by reference. As indicated in the article by S. Naka et al., these single mixed layer organic light emitting devices are generally less efficient than multilayer organic light emitting devices. These devices, which include only a single mixed layer of a hole transport material, such as NPB (N,N'-di(naphthalene-1-yl)-N,N'-diphenyl-benzidine), and an emitting electron transport material, such as Alq3 (tris (8-hydroxyquinoline) aluminum), are believed to be unstable and to have poor efficiency. The instability of these devices is believed to be caused by the direct contact between the electron transport material in the mixed layer and the hole injecting contact comprised of indium tin oxide (ITO), which results in the formation of an unstable cationic electronic transport material, and the instability of the mixed layer/cathode interface, see H. Aziz et al., Science 283, 1900 (1999), the disclosure of which is totally incorporated herein by reference. In addition, the single mixed layer may result in high leakage currents and hence poor efficiency, see Z. D. Popovic et al., Proceedings of the SPIE, Vol. 3176, "Organic Light-Emitting Materials and Devices II", San Diego, Calif., Jul. 21–23, 1998, pp. 68 to 73, the disclosure of which is totally incorporated herein by reference.

While recent progress in organic EL research has elevated the potential of organic EL devices for widespread applications, the operational stability of current available devices may in some instances be below expectations. A number of known organic light emitting devices have relatively short operational lifetimes before their luminance drops to some percentage of its initial value. Providing interface layers as described, for example, in S. A. Van Slyke et al., "Organic Electroluminescent Devices with Improved Stability," Appl. Phys. Lett. 69, pp. 2160–2162, 1996, and doping as described, for example, in Y. Hamada et al., "Influence of the Emission Site on the Running Durability of Organic Electroluminescent Devices", Jpn. J. Appl. Phys. 34, pp. L824–L826, 1995, may perhaps increase the operational lifetime of organic light emitting devices for room temperature operation, however, the effectiveness of these organic light emitting devices deteriorates for high temperature device operation. In general, the device lifetime can be reduced by a factor of about two for each 10° C. increment in the operational temperature. Moreover, at high temperatures, the susceptibility of the organic light emitting devices to degrade is increased as described, for example, in Zhou et al., "Real-Time Observation of Temperature Rise and Thermal Breakdown Processes in Organic Leds Using an IR Imaging And Analysis System", Advanced Materials 12, pp 265–269, 2000, which further reduces the stability of the devices. As a result, the operational lifetime of these organic light emitting devices at a normal display luminance level of about 100 cd/m2 is limited, for example, to about a hundred hours or less at temperatures of about 60° C. to about 80° C., reference J. R. Sheats et al., "Organic Electroluminescent Devices", Science 273, pp. 884–888, 1996, and also S. Tokito et al., "High-Temperature Operation of an Electroluminescent Device Fabricated Using a Novel Triphenylamine Derivative", Appl. Phys. Lett. 69, 878 (1996).

SUMMARY

This invention provides in embodiments organic light emitting devices with, for example, excellent operational lifetimes. The organic light emitting devices according to embodiments of the present invention can provide operational stability at high temperatures, such as, for example, an operational lifetime of several hundreds of hours, such as 1,200 hours at a high brightness of, for example, about 1,500 candelas per square meter (cd/m$^2$) at temperatures of from about 70° C. to about 100° C., which corresponds to up to several thousands of hours, such as about 10,000 hours, for typical display luminance of about 100 cd/m$^2$ at temperatures of from about 80° C. to about 100° C. Also, the organic light emitting device according to embodiments of the present invention demonstrate reduced increases in driving voltage, such as, for example, increases of not more than about 5 percent of the initial value of the driving voltage even after operation for about 250 hours at a temperature of about 90° C., which is about 10 times smaller than increases in a number of prior art devices, such as for example, devices illustrated by Van Slyke et al.

EMBODIMENTS

Figure 1:
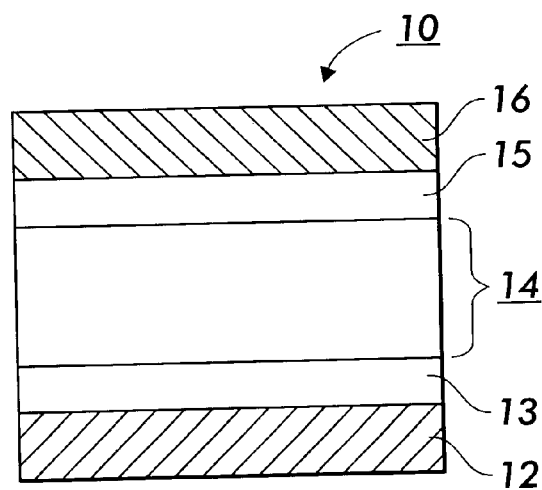
FIG. 1 illustrates an organic light emitting device according to this invention.

Aspects of the present invention relate to an organic light emitting device comprising (i) an anode;

(ii) a hole transport layer comprising a mixture of a porphyrin and a hole transport material;

(iii) a mixed region comprising a mixture of (1) a hole transport material, and (2) an electron transport material, and which mixed region optionally contains an organic luminescent material;

(iv) a cathode, and wherein the organic light emitting device optionally further comprises at least one of (v) an electron transport region interposed between the mixed region and the cathode; and (vi) an optional thermal protective element coated on one of the anode and cathode; a device wherein there is at least one of (A) the hole transport material (ii), (iii) and which is selected from the group consisting of tertiary aromatic amines and indolocarbazoles; and (B) wherein at least one of the electron transport material (iii), (v) is selected from the group consisting of metal oxinoids, stilbenes, triazines, and quinolines; a device wherein there is at least one of (A) the hole transport material or component in the hole transport layer, and the hole transport component comprising the mixed region are the same or similar; and (B) wherein there is selected an electron transport region, and wherein the electron transport component comprising the mixed region (iii) and the electron transport region (v) are the same or similar; a device wherein there is at least one of (A) the hole transport component comprising the hole transport layer, and the hole transport component comprising the mixed region are different components; and (B) wherein there is an electron transport region, and wherein the electron transport component contained in the electron transport region and the electron transport component comprising the mixed region are different components; a device wherein the porphyrin is a phthalocyanine; a device wherein the porphyrin is copper phthalocyanine (CuPc); a device wherein the hole transport layer (ii) comprises from about 25 weight percent to about 99 weight percent of CuPc, and from about 75 weight percent to about 1 weight percent of the hole transport component, and wherein the total thereof is about 100 percent; a device wherein the hole transport layer (ii) comprises from about 50 weight percent to about 99 weight percent of CuPc, and from about 50 weight percent to about 1 weight percent of the hole transport component; a device wherein the hole transport component of hole transport layer (ii) is selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole and 2,8-dimethyl-5,11-di-naphthyl-5,11-dihydroindolo[3,2-b]carbazole; a device wherein the mixed region (iii) comprises from about 20 weight percent to about 80 weight percent of a hole transport component of a tertiary aromatic amine, and from about 80 weight percent to about 20 weight percent of an electron transport component of a metal oxinoid; a device wherein the mixed region (iii) comprises from about 35 weight percent to about 65 weight percent of the hole transport component, and from about 65 weight percent to about 35 weight percent of the electron transport component; a device wherein the hole transport component of (iii) is tertiary aromatic amine selected from the group consisting of N,N'-di(naphthalene-1-yl)-N,N'-diphenyl-benzidine (NPB) and N,N'-bis(p-biphenyl)-N,N'-diphenyl benzidine (biphenyl TPD), and the electron component is a metal oxinoid elected from the group consisting of tris(8-hydroxyquinoline)aluminum (Alq3) and bis(8-hydroxyquinolato)-(4-phenylphenolato)aluminum (Balq); a device wherein the mixed region comprises from about 0.01 weight percent to about 10 weight percent of a fluorescent luminescent component; a device wherein the fluorescent component is selected from the group consisting of coumarin, dicyanomethylene pyranes, polymethine, oxabenzanthrane, xanthene, pyrylium, carbostyl, perylene, acridone, quinacridone, rubrene, anthracene, coronene, phenanthrecene, pyrene, butadiene, stilbene, lanthanide metal chelate complexes, rare-earth metal chelate complexes, and 4-(dicyanomethylene)-2-I-propyl-6-(1,1,7,7-tetramethyljulolidyl-9-enyl)-4H-pyran; a device wherein the fluorescent component is selected from the group consisting of rubrene, N,N'-dimethylquinacridone (DMQ), 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T), and (2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4-ylidene) propanedinitrile (DCJTB); a device wherein the mixed region comprises from about 3 weight percent to about 30 weight percent of a phosphorescent luminescent component; a device wherein the phosphorescent component is selected from the group consisting of 2,3,7,8,12,13,17,18-octaethyl-21H,23H-phorpine platinum(II) (PtOEP) and fac tris(2-phenylpyridine)iridium (Ir(ppy)3); a device wherein the electron transport region is present, and wherein the electron transport region comprises at least two layers; a device wherein (1) a first layer of the electron transport region contacts the mixed region, and which first layer comprises a component selected from the group consisting of metal oxinoids and quinolines; and (2) the second layer of the electron transport region contacts the cathode, and which second layer comprises a component selected from the group consisting of metal oxinoids, phthalocyanines, and triazines; a device wherein the first layer comprises a metal oxinoid of tris(8-hydroxyquinoline)aluminum (Alq3) or bis(8-hydroxyquinolato)-(4-phenylphenolato)aluminum (Balq); or a quinoline of 1,4-bis(4-phenylquinolin-2-yl)benzene, or 4,4'-bis(4-phenylquinolin-2-yl)-1,1'-biphenyl (TA); and the second layer comprises a metal oxinoid of tris(8-hydroxyquinoline)aluminum (Alq3) or bis(8-hydroxyquinolato)-(4-phenylphenolato)aluminum (Balq); a phthalocyanine of copper phthalocyanine (CuPc); or a triazine of 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine; a device wherein there is at least one of (A) the anode comprising a layer of indium-tin-oxide, and (B) the cathode comprising a layer selected from the group consisting of (i) a layer comprised of Mg and Ag; (ii) a layer comprised of Al; (iii) a layer comprised of indium-tin-oxide; and (iv) a layer comprised of (1) an organic compound, (2) Mg, and (3) Ag; a device wherein the cathode further comprises an alkaline metal or a compound thereof; a device wherein the alkaline metal is selected from the group consisting of Li, Na, K and Cs; a device wherein there is present the thermal protective coating comprised of a layer of SiO, SiO2 or mixtures thereof; a device wherein the mixed region has a thickness of from about 5 nanometers to about 500 nanometers; the hole transport layer has a thickness of from about 5 nanometers to about 250 nanometers; and the electron transport region has a thickness of from about 5 nanometers to about 100 nanometers; a device comprising (i) a hole transport layer coated on the anode and comprised of from about 50 weight percent to about 99 weight percent of copper phthalocyanine (CuPc), and from about 50 weight percent to about 1 weight percent of a hole transport component selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole, and which region has a thickness of from about 5 nanometers to about 100 nanometers;

(ii) a mixed region situated on the hole transport region comprised of from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD), and from about 65 weight percent to about 35 weight percent of tris (8-hydroxyquinoline)aluminum or bis(8-hydroxyquinolato)-(4-phenylphenolato)aluminum, wherein all weight percents are based on the total weight of components comprising the mixed region, and wherein the thickness of the mixed region is from about 20 nanometers to about 200 nanometers;

(iii) an electron transport region situated on the mixed region comprised of tris(8-hydroxyquinoline) aluminum (Alq3) or bis(8-hydroxyquinolato)-(4-phenylphenolato)aluminum (Balq), wherein the thickness of the electron transport region is from about 5 nanometers to about 50 nanometers; and (iv) a cathode situated on the electron transport region; a device wherein the mixed region further contains one of (i) about 0.2 weight percent to about 2 weight percent of a luminescent component selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);

(ii) about 0.2 weight percent to about 5 weight percent of (2-(1,1-dimethylethyl)-6-(2-(2,3,6,7-tetrahydro-1,1,7,7-tetramethyl-1H,5H-benzo (ij)quinolizin-9-yl) ethenyl)-4H-pyran-4-ylidene)propanedinitrile (DCJTB); and (iii) about 5 weight percent to about 15 weight percent of 2,3,7,8,12,13,17,18-octaethyl-21H,23H-phorpine platinum(II) (PtOEP), wherein all weight percents are based on the total weight of components comprising the mixed region; a device comprising (i) an anode of indium-tin-oxide with a thickness of from about 30 to about 300 nanometers, and which anode is present on a substrate, the anode and the substrate being capable of transmitting at least about 70 percent of radiation of wavelength of from about 400 nanometers to about 750 nanometers;

(ii) a hole transport layer situated on and in contact with the anode, and which layer is comprised of from about 50 weight percent to about 99 weight percent of copper phthalocyanine (CuPc), and from about 50 weight percent to about 1 weight percent of a hole transport component selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo [3,2-b]carbazole, and 2,8-dimethyl-5,11-di-naphthyl-5,11-dihydroindolo[3,2-b]carbazole, and which region has a thickness of from about 5 nanometers to about 100 nanometers;

(iii) a mixed region situated on the hole transport region comprised of from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD), and from about 65 weight percent to about 35 weight percent of tris (8-hydroxyquinoline) aluminum or bis(8-hydroxyquinolato)-(4-phenylphenolato)aluminum wherein all weight percents are based on the total weight of components comprising the mixed region, and wherein the thickness of the mixed region is from about 20 nanometers to about 200 nanometers;

(iv) an electron transport region situated on the mixed region comprised of tris(8-hydroxyquinoline) aluminum (Alq3) or bis(8-hydroxyquinolato)-(4-phenylphenolato)aluminum (Balq) wherein the thickness of the electron transport region is from about 5 nanometers to about 50 nanometers;

(v) a cathode situated on the electron transport region comprised of one of (1) a layer comprised of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag; and from about 55 volume percent to about 40 volume percent of Alq3 wherein the thickness of the first layer is from about 100 nanometers to about 600 nanometers, and coated with a second layer of thickness of from about 50 nanometers to about 500 nanometers comprising a metal or a metal alloy; and (vi) a thermal protective layer, and which layer is comprised of SiO, SiO2 or mixtures thereof of a thickness of from about 100 nanometers to about 1,000 nanometers; a device wherein the mixed region further comprises one of (i) about 0.2 weight percent to about 2 weight percent of a luminescent component selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);

ii) about 0.2 weight percent to about 5 weight percent of (2-(1,1-dimethylethyl)-6-(2-(2,3,6,7-tetrahydro-1,1,7,7-tetramethyl-1H,5H-benzo(ij)quinolizin-9-yl) ethenyl)-4H-pyran-4-ylidene)propanedinitrile (DCJTB); and (iii) about 5 weight percent to about 15 weight percent of 2,3,7,8,12,13,17,18-octaethyl-21H,23H-phorpine platinum(II) (PtOEP) wherein all weight percents are based on the total weight of components comprising the mixed region; a device wherein (i) the anode is indium-tin-oxide with a thickness of from about 30 to about 300 nanometers, and which anode is coated on a substrate;

(ii) the hole transport layer is situated on the anode, and which layer is comprised of from about 50 weight percent to about 99 weight percent of copper phthalocyanine (CuPc), and from about 50 weight percent to about 1 weight percent of a hole transport component selected from the group consisting of N,N'-di (naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo [3,2-b]carbazole, and 2,8-dimethyl-5,11-di-naphthyl-5, 11-dihydroindolo[3,2-b]carbazole, and which layer has a thickness of from about 5 nanometers to about 100 nanometers;

(iii) a mixed region situated on the hole transport region comprised of from about 35 weight percent to about 65 weight percent of N,N'-di(naphthalene-1-yl)-N,N'-diphenyl-benzidine (NPB) or N,N'-bis(p-biphenyl)-N, N'-diphenyl benzidine (biphenyl TPD), and from about 65 weight percent to about 35 weight percent of tris (8-hydroxyquinoline) aluminum or bis(8-hydroxyquinolato)-(4-phenylphenolato)aluminum wherein all weight percents are based on the total weight of components comprising the mixed region, and wherein the thickness of the mixed region is from about 20 nanometers to about 200 nanometers;

(iv) an electron transport region situated on the mixed region comprising (1) a first layer of thickness of from about 5 nanometers to about 25 nanometers contacting the mixed region, and wherein this first layer is comprised of tris(8-hydroxyquinoline)aluminum (Alq3), bis(8-hydroxyquinolato)-(4-phenylphenolato) aluminum (Balq), or 1,4-bis(4-phenylquinolin-2-yl) benzene, 4,4'-bis(4-phenylquinolin-2-yl)-1,1'-biphenyl (TA); and (2) a second layer of a thickness of from about 5 nanometers to about 25 nanometers contacting the cathode, and wherein the second layer is comprised of tris(8-hydroxyquinoline)aluminum (Alq3), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4, 6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'v-bis-[2-(4,6-di-p-methoxyphenyl-1,3,5-triazinyl)]-1,1'-biphenyl, 4,4-bis-[2-(4,6-di-m-methoxyphenyl-1,3,5-triazinyl)]-1,1'-biphenyl, or 2,4,6-tris(4-biphenylyl)-1, 3,5-triazine;

(v) a cathode situated on the electron transport region comprised of one of (1) a layer comprised of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag and from about 55 volume percent to about 40 volume percent of Alq3 wherein the thickness of the first layer is from about 100 nanometers to about 600 nanometers; and coated with a second layer of a thickness of from about 50 nanometers to about 500 nanometers comprising a metal or a metal alloy; and (vi) a thermal protective layer situated on the cathode comprised of SiO, SiO2 or mixtures thereof, and which cathode is of a thickness of from about 100 nanometers to about 1,000 nanometers; a device wherein the mixed region further comprises one of (i) about 0.2 weight percent to about 2 weight percent of a luminescent component selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);

(ii) about 0.2 weight percent to about 5 weight percent of (2-(1,1-dimethylethyl)-6-(2-(2,3,6,7-tetrahydro-1,1,7, 7-tetramethyl-1H,5H-benzo (ij)quinolizin-9-yl) ethenyl)-4H-pyran-4-ylidene)propanedinitrile (DCJTB); and (iii) about 5 weight percent to about 15 weight percent of 2,3,7,8,12,13,17,18-octaethyl-21H,23H-phorpine platinum(II) (PtOEP), wherein all weight percents are based on the total weight of components comprising the mixed region; a device wherein the mixed region is capable of emitting light in response to hole electron recombination; a device wherein each of the region contains from about 1 to about 7 layers; a device wherein each of the region contains from about 2 to about 4 layers; a device wherein the hole transport component, or the electron transport component of (iii) additionally functions as a luminescent material; a device further including a luminescent material in (iii); a device wherein the device further contains a protective layer of a silicon oxide, silicon dioxide or mixtures thereof, and wherein (v), (vi) or both (v) and (vi) are present; a device wherein the porphyrin is a copper phthalocyanine and the (v), (vi) or both (v) and (vi) are present; a device comprised of (i) an anode;

(ii) a hole transport layer comprising a mixture of a porphyrin and a hole transport material;

(iii) a mixed region comprising a mixture of (1) a hole transport material, and (2) an electron transport material, and which mixed region optionally contains an organic luminescent material;

(iv) a cathode, and wherein the organic light emitting device optionally further comprises at least one of (v) an electron transport region interposed between the mixed region and the cathode; and (vi) a thermal protective element coated on one of the anode and cathode; an electroluminescent (EL) device comprising (i) an anode (ii) a single hole transport layer comprising a mixture of porphyrin and a hole transport material;

(iii) a mixed region, which region can be one layer, or a plurality of layers, such as from 2 to about 7 or typically from 2 to about 4 layers, each of a thickness of, for example, from about 5 nanometers to about 5,000 nanometers and comprising a mixture of (1) a hole transport material, and (2) an electron transport material, and which mixed region can further comprise an organic luminescent material; and wherein the mixed to region emits light in response to hole electron recombination;

(iv) a cathode, and wherein the organic light emitting device can further comprise (i) an electron transport region, which region can be one layer, or a plurality of layers, such as from 2 to about 7 or typically from 2 to about 4 layers, interposed between the mixed region and the cathode;

(ii) a thermal protective element or layer coated on one of the anode and the cathode, or both the anode and cathode.

The hole transport layer and the electron transport region function, it is believed, to achieve a more balanced charge injection process, and to reduce leakage of the carriers to the counterelectrodes (Z. D. Popovic et al., *Proceedings of the SPIE*, Vol. 3176, "Organic Light-Emitting Materials and Devices II", San Diego, Calif., Jul. 21–23, 1998, pp. 68–73, the disclosure of which is totally incorporated herein by reference), and therefore, can demonstrate higher efficiency compared to other organic light emitting devices, reference, for example, organic light emitting devices disclosed in U.S. Pat. Nos. 5,853,905; 5,925,980; 6,114,055; and 6,130,001, the disclosures of which are totally incorporated herein by reference.

An example of an organic light emitting device according to specific embodiments of the present invention is illustrated in FIG. 1 wherein the organic light emitting device 10 comprises a first electrode 12 serving as a hole injecting anode; laminated or coated on the first electrode 12 is a single hole transport layer 13 comprising a mixture of a porphyrin and a hole transport material; laminated or coated on the hole transport layer 13 is a mixed region 14 comprising a mixture of (1) a hole transport material, and (2) an electron transport material, and which mixed region may contain an organic luminescent material, such as, for example, a fluorescent or a phosphorescent material; laminated or coated on the mixed region 14 is an electron transport region 15; and laminated or coated on the electron to transport region 15 is a second electrode 16 serving as an electron injecting electrode.

Figure 2:
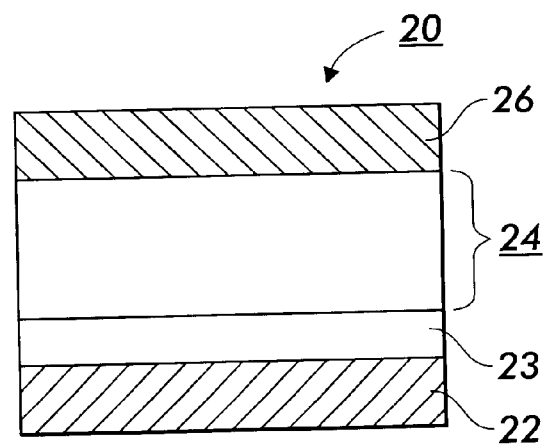
FIG. 2 illustrates another organic light emitting device according to this invention. "Region" refers to one layer unless otherwise stated.

Depending on the charge transport properties of the materials used, it may be desirable in embodiments of the present invention to eliminate the electron transport region situated, for example, between the mixed region and the cathode; and wherein the mixed region contacts the cathode. An exemplary embodiment of the aforementioned organic light emitting device is illustrated in FIG. 2 wherein device 20 comprises a first electrode 22 serving as a hole injecting anode; laminated on the first electrode 22 is a single hole transport layer 23 comprising a mixture of porphyrin and a hole transport material; laminated on the hole transport layer 23 is a mixed region 24 comprising a mixture of (1) a hole transport material, which material may also function as a luminescent material, and (2) an electron transport material, and which mixed region contains an organic luminescent material, such as, for example, a fluorescent or a phosphorescent material; and laminated on the mixed region 24 is a second electrode 26 serving as an electron injecting cathode.

In embodiments, the hole transport layers 13, 23 are comprised of from about 50 weight percent to about 99 weight percent of the porphyrin, and from about 50 weight percent to about 1 weight percent of the hole transport material, and wherein the performance of the organic light emitting devices 10 and 20 may depend on the mixing ratio of the porphyrin and the hole transport material in the hole transport layers 13 and 23. Also, in embodiments, a thermal protective element, reference copending patent applications U.S. Ser. No. 09/770,159 and U.S. Ser. No. 09/770,154, the disclosures of which are totally incorporated herein by reference, can be laminated on the first electrode 12, 22 or on the second electrode 16, 26, a thermal protective element can thus be laminated on a cathode, an anode, or both.

The hole transport material comprising the hole transport layers 13, 23 and the hole transport material comprising the mixed regions 14, 24 can be the same materials or different materials, examples of which are illustrated in, for example, copending patent application U.S. Ser. No. (not yet assigned—D/A1251), filed concurrently herewith, and wherein the use of different hole transport materials in the mixed regions 14, 24 and the hole transport regions 13, 23 can result in a number of desirable features, such as for example, increase the stability of the organic light emitting devices 10, 20.

Similarly, the electron transport material comprising the mixed region 14 and the electron transport material comprising the electron transport region 15 can be the same material, or different materials, examples of which are illustrated, for example, in copending patent application U.S. Ser. No. (not yet assigned—D/A1251), filed concurrently herewith, and wherein the use of different electron transport materials in the mixed region 14 and the electron transport region 15 can enable desirable features, such as, for example, increasing the efficiency of the organic light emitting device 10. Also, the electron transport materials used in the different layers of the multiple-layer electron transport region can be different or similar.

One of the electrodes comprises a metal-organic mixed region including (i) a metal first component, such as, for example, Mg; (ii) an organic material second component, such as, for example, $AlQ_3$; and (iii) at least one third component selected from the group consisting of metals, organic materials and inorganic materials, such as, for example, Ag, reference copending patent application U.S. Ser. No. 09/800,716, the disclosure of which is totally incorporated herein by reference. Therefore, for example, the cathode 16 of the organic light emitting device can comprise a metal-organic mixed region including (i) a metal first component, such as, for example, Mg; (ii) an organic material second component, such as, for example, $AlQ_3$; and (iii) at least one third component selected from the group consisting of metals, organic materials and inorganic materials, such as, for example, Ag.

The organic light emitting devices can in embodiments be operated under DC alternating current (AC) and/or direct current (DC) driving conditions. AC driving conditions can provide extended operational lifetimes, especially in high temperature device operation conditions. More specific voltage values include, for example, from about 3 to about 20 volts, and more specifically, from about 5 to about 15 volts; driving currents include, for example, from about 1 to about 1,000 mA/cm$^2$ density, and more specifically, from about 10 mA/cm$^2$ to about 200 mA/cm$^2$.

The anodes 12, 22 can comprise suitable positive charge injecting electrodes such as indium tin oxide (ITO), silicon, tin oxide, gold or platinum. Other suitable materials for the anode include, but are not limited to, electrically conductive carbon, π-conjugated polymers, such as polyaniline, polythiophene, polypyrrole, and the like, with, for example, a work function equal to, or greater than, about 4 eV, and more specifically, from about 4 eV to about 6 eV.

The anodes 12, 22 can be of any suitable form. A thin conductive layer can be coated onto a light transmissive substrate, for example, a transparent or substantially transparent glass plate or plastic film, thus the anode can comprise a light transmissive anode formed from tin oxide or indium tin oxide (ITO) coated on a glass plate. Also, very thin light-transparent metallic anodes having a thickness of, for example, less than about 200 Å, and more specifically, from about 75 Å to about 150 Å can be used, and which thin anodes can comprise metals such as gold, palladium and the like. In addition, transparent or semi-transparent thin layers of conductive carbon or conjugated polymers, such as polyaniline, polythiophene, polypyrrole and the like, with a thickness of, for example, from about 50 Å to about 175 Å can be selected as anodes. A number of examples for the anodes 12, 22, and the cathodes 16, 26 are disclosed in U.S. Pat. No. 4,885,211, the disclosure of which is totally incorporated herein by reference. The thickness of the anodes 12, 22 can be from about 1 nanometer to about 5,000 nanometers, and more specifically, from about 30 nanometers to about 300 nanometers.

The hole transport layers 13, 23 can comprise a porphyrin and the hole transport material in various amount ratios. Typically, the hole transport layer is comprised of from about 25 weight percent to about 99 weight percent of a porphyrin, and from about 75 weight percent to about 1 weight percent of the hole transport material. More specifically, this layer is comprised of from about 50 weight percent to about 99 weight percent of the porphyrin, and from about 50 weight percent to about 1 weight percent of the hole transport material. The performance of the organic light emitting devices 10, 20 in embodiments may be dependent on the amount ratio of the porphyrin, and the hole transport material in the hole transport layers 13, 23.

Suitable porphyrins that can be selected for the hole transport layers 13, 23 include the porphyrins as disclosed in U.S. Pat. No. 4,356,429, the disclosure of which is totally incorporated herein by reference; 1,10,15,20-tetraphenyl-21H,23H-porphyrin copper (II), copper phthalocyanine; copper tetramethyl phthalocyanine; zinc phthalocyanine; titanium oxide phthalocyanine; magnesium phthalocyanine; and the like, or mixtures thereof.

Suitable hole transport materials for the hole transport layers 13, 23 in contact with, for example, the anode and the mixed regions 14, 24 include, but are not limited to, conductive materials such as polyaniline and its acid-doped forms, polypyrrole, poly(phenylene vinylene), or mixtures thereof. Specific illustrative examples of hole transporting materials include the aromatic tertiary amines such as those illustrated in U.S. Pat. Nos. 4,539,507; 4,720,432 and 5,061,569, the disclosures of which are totally incorporated herein by reference. Examples of aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, aromatic amines like are N,N,N',N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidines are N,N'-di-1-naphthyl-N,N'-diphenyl-1,1'-biphenyl-4,4'-diamine, which is more specific; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. More specific hole transport materials also include N,N'-di(naphthalene-1-yl)-N,N'-diphenyl-benzidine (NPB), N,N'-bis(p-biphenyl)-N,N'-diphenyl benzidine (biphenyl TPD) and derivatives thereof; polynuclear aromatic amines, such as N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl] aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds like 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like, reference the indolocarbazoles, the components of U.S. Pat. Nos. 5,942,340 and 5,952,115, the disclosures of each of which are totally incorporated herein by reference, such as for example 5,11-di-naphthyl-5,11-dihydroindolo[3,2-b]carbazole and 2,8-dimethyl-5,11-di-naphthyl-5,11-dihydroindolo[3,2-b] carbazole; N,N,N',N'-tetraarylbenzidines, wherein aryl may be from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N-di-1-naphthyl-N,N'-diphenyl-1,1'-biphenyl-4,4'-diamine; N,N'-bis(3-methylphenyl)-N,N'-diphenyl-1,1-biphenyl-4,4'-diamine; N,N'-bis(3-methoxyphenyl)-N,N'-diphenyl-1,1'-biphenyl-4,4'-diamine, and the like, and wherein the hole transport layers 13, 23 can be of a thickness of from about 1 nanometer to about 500 nanometers, or from about 5 nanometers to about 150 nanometers, and more specifically, from about 10 to about 50 nanometers, and wherein the hole transport layers 13, 23 can be prepared by various suitable methods, such as for example vapor deposition like by simultaneous evaporation of pure porphyrin and pure hole transport material from separate sources, and controlling the evaporation rate of each material to achieve the desired mixing ratio and spin-coating techniques. The mixed regions 14, 24 further comprise an electron transport material. At least one of the hole transport material layer and the electron transport material layer used in forming the mixed region can in embodiments be selected to function as a luminescent material. Furthermore, the mixed regions can further comprise a luminescent material in addition to the hole transport region and the electron transport. The electron transport materials that can be selected for the mixed regions 14, 24 and the electron transport region 15 in contact with the mixed region 14 can be the same or different materials. In addition, the electron transport materials used in the different layers of the multiple-layer electron transport region can be different or similar.

Illustrative examples of electron transport materials for the mixed regions 14, 24 and the electron transport region 15 include, but are not limited to, the metal oxinoids as disclosed in U.S. Pat. Nos. 4,539,507; 5,151,629; 5,150,006; 5,141,671, and 5,846,666, the disclosures of which are totally incorporated herein by reference; tris(8-hydroxyquinolinate) aluminum ($Alq_3$); bis(8-hydroxyquinolato)-(4-phenylphenolato)aluminum (Balq); tris(8-hydroxyquinolinate)gallium, bis(8-hydroxyquinolinate) magnesium, bis(8-hydroxyquinolinate) zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h]quinolinate) beryllium, and the like; stilbene derivatives, such as those disclosed in U.S. Pat. No. 5,516,577, the disclosure of which is totally incorporated herein by reference, such stilbene including, for example, 4,4'-bis(2,2-diphenylvinyl)biphenyl; metal thioxinoid compounds as illustrated in U.S. Pat. No. 5,846,666, the disclosure of which is totally incorporated herein by reference, like metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like; bis(8-quinolinethiolato) zinc, bis(8-quinolinethiolato)cadmium, tris(8-quinolinethiolato)gallium, tris(8-quinolinethiolato)indium and bis[benzo{f}-8-quinolinethiolato]zinc; oxadiazole metal chelates, reference U.S. Pat. No. 5,925,472, the disclosure of which is totally incorporated herein by reference, such as bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato] beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis[2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato] zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato] zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato] beryllium; bis[2-(2-hydroxyphenyl)-5-(1-naphthyl)-1,3,4-thiadiazolato]zinc; bis[2-(2-hydroxyphenyl)-5-(1-naphthyl)-1,3,4-thiadiazolato]beryllium, and the like; for the mixed regions 14, 24 and in the electron transport region 15 quinolines, such as, for example, 1,4-bis(4-phenylquinolin-2-yl)benzene, 4,4'-bis(4-phenylquinolin-2-yl)-1,1'-biphenyl (TA); triazines as described in U.S. Pat. No. 6,057,048 and U.S. Pat. No. 6,229,012, the disclosures of which are totally incorporated herein by reference, such as, for example, 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, 2,4,6-tris(4-biphenylyl)-1,3,5-triazine, and the like.

Typically, the mixed regions 14, 24 comprise from about 20 weight percent to about 80 weight percent of the hole transport material and from about 80 weight percent to about 20 weight percent of the electron transport material. More specifically, the mixed regions 14, 24 comprise from about 35 weight percent to about 65 weight percent of the hole transport material, and from about 65 weight percent to about 35 weight percent of the electron transport material. Furthermore, in embodiments where the mixed region comprises a luminescent material, the mixed regions 14, 24 can comprise, for example, from about 0.01 weight percent to about 10 weight percent of the fluorescent luminescent material or from about 0.01 weight percent to about 25 weight percent of a phosphorescent luminescent material, where all weight percents are based on the total weight of materials comprising the mixed region.

Illustrative examples of luminescent materials, which materials can be included in the mixed region, and/or be a component present in the device can function as a light emitter include fluorescent dyes, such as, for example those disclosed in U.S. Pat. No. 4,769,292, the disclosure of which is totally incorporated herein by reference, like coumarin, dicyanomethylene pyranes, polymethine, oxabenzanthrane, xanthene, pyrylium, carbostyl, perylene, and the like; dyes selected from the quinacridone derivatives of, for example, the Formula

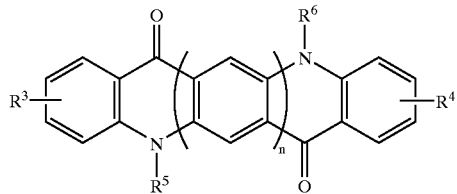

wherein $R^3$ and $R^4$ are independently hydrogen, alkyl, alkoxyl, aryl, fused aryl, such as naphthyl, or halogen; $R^5$ and $R^6$ are independently hydrogen, alkyl or aryl; and n equals 0, 1, 2 or 3; examples of quinacridone dyes being N,N'-dimethylquinacridone, N,N'-dimethyl-2-methyl quinacridone, N,N'-dimethyl-2,9-dimethyl quinacridone, N,N'-dimethyl-2-chloroquinacridone, N,N'-dimethyl-2-fluoroquinacridone, and N,N'-dimethyl-1,2-benzoquinacridone; the quinacridone dyes like quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like, as described in U.S. Pat. Nos. 5,227,252; 5,276,381 and 5,593,788, the disclosures of which are totally incorporated herein by reference, like perylene, rubrene, anthracene, coronene, phenanthrecene, pyrene and the like, as illustrated in U.S. Pat. No. 3,172,862, the disclosure of which is totally incorporated herein by reference; butadienes, such as 1,4-diphenylbutadiene and tetraphenylbutadiene, and stilbenes and the like, as illustrated in U.S. Pat. Nos. 4,356,429 and 5,516,577, the disclosures of which are incorporated herein by reference; fluorescent materials described in U.S. Pat. No. 5,601,903, the disclosure of which is totally incorporated herein by reference; fluorescent components illustrated in U.S. Pat. No. 5,935,720, the disclosure of which is totally incorporated herein by reference, such as, for example, 4-(dicyanomethylene)-2-I-propyl-6-(1,1,7,7-tetramethyljulolidyl-9-enyl)-4H-pyran and (2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4-ylidene)propanedinitrile (DCJTB); coumarins of the formula

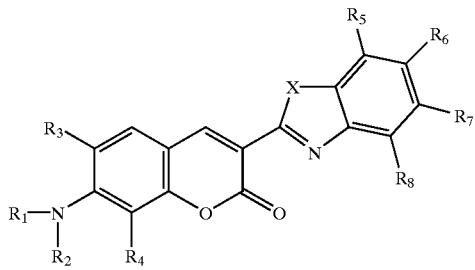

wherein X is selected from the group consisting of oxygen atom, sulfur atom, alkyl imino group ($R_9$—N|, wherein $R_9$ is an alkyl group with from about 1 to about 10 carbons), and aryl imino group (Ar—N|, wherein Ar is a phenyl group); $R_1$ and $R_2$ are individually selected from the group consisting of: alkyl of from 1 to 20 carbon atoms, aryl, and carbocyclic systems; $R_3$ and $R_4$ are individually selected from the group consisting of hydrogen atom, alkyl of from 1 to 10 carbon atoms, and a branched or unbranched 5 or 6 member substituent ring connecting with $R_1$, $R_2$, respectively; and $R_5$, $R_6$, $R_7$, and $R_8$ are individually selected from the group consisting of hydrogen atom, alkoxy of from 1 to about 10 carbon atoms and alkyl group of from 1 to about 20 carbon atoms; 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T), and those disclosed in U.S. Pat. No. 6,020,078, the disclosure of which is totally incorporated by reference; lanthanide metal chelate complexes, such as for example, tris(acetylacetonato)(phenanthroline) terbium, tris(acetyl acetonato)(phenanthroline) europium, and tris(thenoyl trisfluoroacetonato) (phenanthroline) europium, reference Kido et al., "White light emitting organic electroluminescent device using lanthanide complexes", *Jpn. J. Appl. Phys.*, Volume 35, pp. L394–L396 (1996); phosphorescent materials, such as, for example, organometallic compounds containing a heavy metal atoms that can result in spin-orbit coupling such as those disclosed in Baldo et al., "Highly efficient organic phosphorescent emission from organic electroluminescent devices", *Letters to Nature*, Volume 395, pp 151–154 (1998); 2,3,7,8,12,13, 17,18-octaethyl-21H,23H-phorpine platinum(II) (PtOEP) and others, such as, for example, those disclosed in U.S. Pat. No. 6,048,630 and fac tris(2-phenylpyridine)iridium (Ir $(ppy)_3$). The mixed regions 14, 24 can be a thickness of from about 10 nanometers to about 2,000 nanometers, or from about 20 nanometers to about 200 nanometers; reference copending application U.S. Ser. No. 09/357,551, the disclosure of which is totally incorporated herein be reference, and reducing the thickness of the mixed regions 14, 24 can result in a desirable decrease in the operational voltage of the organic light emitting device, and an undesirable decrease in the luminance (and EL efficiency) of the organic light emitting device.

The mixed regions 14, 24 can be formed by any suitable method that enables the formation of selected mixtures of the hole transport material, the electron transport material and the optional luminescent material. For example, the mixed regions 14, 24 can be formed by coevaporating the hole transport material, the electron transport material, and the luminescent material.

The electron transport region 15 can comprise an electron transport material with a thickness of, for example, from about 1 nanometer to about 100 nanometers, or from about 5 nanometers to about 50 nanometers. In embodiments where a multiple-layered electron transport region 15 is selected, the individual layers possess a thickness of, for example, at least about 1 nanometer, or from about 1 to about 10 nanometers.

The cathodes 16, 26 formed on the electron transport region 15 or the mixed region 24 can comprise suitable electron injecting materials, such as metals, including high work function components, such as metals, with, for example, a work function from about 4 eV to about 6 eV, or low work function components, such as metals, with, for example, a work function of from about 2 eV to about 4 eV. The cathodes 16, 26 can comprise a combination of a low work function, less than about 4 eV metal, and at least one other metal. Effective proportions of the low work function metal to the second or other metal are from less than about 0.1 weight percent to about 99.9 weight percent. Illustrative examples of low work function metals include, but are not limited to, alkaline metals, such as lithium or sodium; Group 2A or alkaline earth metals, such as beryllium, magnesium, calcium or barium; and Group III metals including rare earth metals and the actinide group metals, such as scandium, yttrium, lanthanum, cerium, europium, terbium or actinium, lithium, magnesium and calcium, are more specific low work function metals; the Mg—Ag alloy cathodes described in U.S. Pat. No. 4,885,211 and U.S. Pat. No. 4,720,432, the disclosures of which are totally incorporated herein by reference, include examples of specific cathode materials for forming the cathodes 16, 26. Also, as illustrated in patent application U.S. Ser. No. 09/800,716, the disclosure of which is totally incorporated herein by reference, the cathode can comprise a metal-organic mixed region including (i) a metal first component, such as, for example, Mg; (ii) an organic material second component, such as, for example, $AlQ_3$; and (iii) at least one third component selected from the group consisting of metals, organic materials and inorganic materials, such as, for example, Ag. Specific cathodes are described in U.S. Pat. No. 5,429,884, the disclosure of which is totally incorporated herein by reference, and which cathodes can be formed from lithium alloys with other high work function metals such as aluminum and indium. The cathodes 16, 26 can also include an electron injection layer in contact with the electron transport region 15 or the mixed region 24 comprised, for example, of an insulative material such as an oxide material or an alkaline metal compound as illustrated in U.S. Pat. Nos. 5,457,565; 5,608,287 and 5,739,635, the disclosures of which are totally incorporated herein by reference. The thickness of the cathodes 16, 26 can be from, for example, about 10 nanometers to about 1,000 nanometers.

A thermal protective element can optionally be formed on the cathodes 16, 26 and/or the anodes 12, 22, reference the protective elements disclosed in copending applications U.S. Ser. Nos. 09/770,159 and 09/770,154, the disclosures of which are totally incorporated herein by reference. Typically, the thermal protective element is a layer comprised of SiO, $SiO_2$ and/or mixtures thereof, and with a thickness ranging from about 300 nanometers to about 5,000 nanometers.

The following Examples are provided. In these Examples, "region" refers to one layer, unless otherwise stated.

EXAMPLE I

Example to Demonstrate the
Operational Stability at 90° C.

An organic light emitting device having a structure, such as the device 10 in FIG. 1, was formed and evaluated. In this device, copper phthalocyanine (CuPc) N,N'-di(naphthalene-1-yl)-N,N'-diphenyl-benzidine (NPB), and tris(8-hydroxyquinoline)aluminum ($Alq_3$) were used as the porphyrin, hole transport material and the electron transport material, respectively, comprising the hole transport layer 13, the mixed region 14, and the electron transport region 15 in the organic light emitting device 10. The hole transport layer 13 was comprised of about 75 weight percent of CuPc and about 25 weight percent of NPB. The mixed region 14 was comprised of about 50 weight percent of NPB and about 50 weight percent of $Alq_3$. The thickness of the hole transport layer 13 was about 25 nanometers; the thickness of the mixed region 14 was about 80 nanometers; and the thickness of the electron transport region 15 was about 20 nanometers. The hole transport layer 13, the mixed layer 14 and the electron transport region 15 were formed between an anode 12 comprised of indium-tin-oxide (ITO) having a thickness of about 200 nanometers, precoated on a glass substrate, and a cathode 16 comprised of a Mg:Ag (10:1 by weight) alloy having a thickness of about 120 nanometers. A thermal protective element comprised of silicon monoxide (SiO) and having a thickness of about 200 nanometers was coated on the cathode 16.

The organic light emitting device was fabricated using a vacuum evaporation process at a pressure of about $6 \times 10^{-6}$ torr. The hole transport layer 13 was produced by coevaporation of pure, about 100 percent for pure throughout, CuPc and pure, about 100 percent for pure throughout, NPB from separate sources with the evaporation rate of the individual sources controlled at about 3 A/s and 1 A/s to obtain the desired mixing ratio. Similarly, the mixed region 14 was produced by coevaporation of pure NPB and pure $Alq_3$ from separate sources with the evaporation rate of each being controlled at about 3 A/s to obtain the desired mixing ratio of the mixed region 14.

Following formation of the organic hole transport layer 13, the mixed region 14 and the electron transport region 15, the metal cathode 16 was deposited on the electron transport region 15 without breaking the vacuum.

The operational lifetime was tested with the above organic light emitting device operated at a temperature of 90° C. in nitrogen gas under AC driving conditions at an average constant current density of 31.25 $mA/cm^2$. At this current density, the organic light emitting device produced a green emission at a luminance of about 600 $cd/m^2$ (candela per square meter).

From operational lifetime tests, the device half-life (the time elapsed before the device luminance decreases to half the initial luminance) from an initial luminance of about 600 $cd/m^2$ was about 500 hours for continuous device operation at a temperature of 90° C. Since the device half-life is measured at an initial luminance of about 600 $cd/m^2$ which is about 6 times brighter than a typical initial display luminance of 100 $cd/m^2$ under normal conditions, the measured half-life of 500 hours represents an accelerated half-life under high stressing conditions at 90° C., which corresponds to a half-life of about 3,000 hours (6×500 hours) at 90° C. under a typical initial display luminance of 100 $cd/m^2$.

EXAMPLE II

Example to Demonstrate
Operational Stability at 90° C.

An organic light emitting device having a structure, such as the device 10 in FIG. 1, was formed and evaluated. In this device, copper phthalocyanine (CuPc) N,N'-di(naphthalene-1-yl)-N,N'-diphenyl-benzidine (NPB), and tris(8-hydroxyquinoline)aluminum ($Alq_3$) were used as the porphyrin, hole transport material and the electron transport material, respectively, comprising the hole transport layer 13, the mixed region 14, and the electron transport region 15 in the organic light emitting device 10. The hole transport layer 13 was comprised of about 75 weight percent of CuPc and about 25 weight percent of NPB. The mixed region 14 was comprised of about 49.8 weight percent of NPB, about 49.8 weight percent of $Alq_3$, and about 0.4 weight percent of a rubrene fluorescent dopant as a luminescent material. The thickness of the hole transport layer 13 was about 25 nanometers, the thickness of the mixed region 14 was about 80 nanometers and the thickness of the electron transport region 15 was about 20 nanometers. The hole transport layer 13, the mixed layer 14, and the electron transport region 15 were formed between an anode 12 comprised of indium-tin-oxide (ITO) having a thickness of about 200 nanometers, precoated on a glass substrate, and a cathode 16 comprised of a Mg:Ag (10:1 by weight) alloy having a thickness of about 120 nanometers. A thermal protective element comprised of silicon monoxide (SiO) and having a thickness of about 200 nanometers was coated on the cathode 16.

The organic light emitting device was fabricated using a vacuum evaporation process at a pressure of about $6 \times 10^{-6}$ torr. The hole transport layer 13 was produced by coevaporation of pure CuPc and pure NPB from separate sources with the evaporation rate of the individual sources controlled at about 3 A/s and 1 A/s to obtain the desired mixing ratio for the hole transport layer 13. Similarly, the mixed region 14 was produced by coevaporation of pure NPB, pure $Alq_3$ and pure rubrene from separate sources with the evaporation rate of each being controlled from about 0.1 A/s to about 10 A/s to obtain the desired mixing ratio in the mixed region 14.

Following formation of the organic hole transport layer 13, the mixed region 14, and the electron transport region 15, the metal cathode 16 was deposited on the electron transport region 15 without breaking the vacuum.

The operational lifetime was tested with the organic light emitting device operated at a temperature of 90° C. in nitrogen gas under AC driving conditions at an average constant current density of 31.25 mA/cm$^2$. At this current density, the organic light emitting device produced yellow emission at a luminance of about 1,900 cd/m$^2$ (candela per square meter).

From operational lifetime tests, the device half-life (the time elapsed before the device luminance decreases to half the initial luminance) from an initial luminance of about 1,900 cd/M$^2$ was about 500 hours for continuous device operation at a temperature of 90° C. Since the device half-life is measured at an initial luminance of about 1,900 cd/m$^2$, which is about 19 times brighter than a typical initial display luminance of 100 cd/m$^2$ under normal conditions, the measured half-life of 500 hours represents an accelerated half-life under high stressing conditions at 90° C., which corresponds to a half-life of about 9,500 hours (19×500 hours) at 90° C. under a typical initial display luminance of 100 cd/m$^2$.

Examples I and II demonstrate, for example, that an organic light emitting devices according to embodiments of the present invention can be used in applications when a device half-life of several thousands of hours at an initial luminance of about 100 cd/m$^2$ at high temperature operation conditions, such as, for example, temperatures of from about 80° C. to about 100° C., are selected. Furthermore, the organic light emitting devices can generate different emission colors, such as, for example, red, yellow, green, or blue emission, by using different luminescent materials in the mixed regions 14, 24.

In contrast, the half-life of an EL device described by Van Slyke et al., which contains a hole transport region of a separate layer of porphyrin and a separate hole transport material, is known, it is believed, to be limited to a few hundred hours or less at an initial luminance of 100 cd/M$^2$ at the above high temperatures, reference also, for example, an EL device of J. R. Sheats et al., "Organic Electroluminescent Devices", *Science* 273, pp. 884–888, 1996, and also S. Tokito et al., "High-Temperature Operation of an Electroluminescent Device Fabricated Using a Novel Triphenylamine Derivative", *Appl. Phys. Lett.* 69, 878 (1996).

EXAMPLE III

A first organic light emitting (device III-A) device having a structure, such as the device 10 in FIG. 1, was formed and evaluated. In this device, copper phthalocyanine (CuPc) N,N'-di(naphthalene-1-yl)-N,N'-diphenyl-benzidine (NPB), and tris(8-hydroxyquinoline)aluminum (Alq$_3$) were used as the porphyrin, hole transport material, and the electron transport material, respectively, comprising the hole transport layer 13, the mixed region 14, and the electron transport region 15 in the organic light emitting device 10. The hole transport layer 13 was comprised of about 75 weight percent of CuPc and about 25 weight percent of NPB. The mixed region 14 was comprised of about 49.8 weight percent of NPB, about 49.8 percent weight percent of Alq$_3$, and about 0.4 weight percent of rubrene fluorescent dopant as a luminescent material. The thickness of the hole transport layer 13 was about 25 nanometers; the thickness of the mixed region 14 was about 80 nanometers; and the thickness of the electron transport region 15 was about 20 nanometers. The hole transport layer 13, the mixed layer 14, and the electron transport region 15 were formed between an anode 12 comprised of indium-tin-oxide (ITO) having a thickness of about 200 nanometers, precoated on a glass substrate; and a cathode 16 comprised of a Mg:Ag (10:1 by weight) alloy having a thickness of about 120 nanometers. A thermal protective element comprised of silicon monoxide (SiO) and having a thickness of about 200 nanometers was coated on the cathode 16.

The organic light emitting device was fabricated using a vacuum evaporation process at a pressure of about 6×10$^{-6}$ torr. The hole transport layer 13 was produced by coevaporation of pure CuPc and pure NPB from separate sources with the evaporation rate of the individual sources controlled at about 3 A/s and 1 A/s to obtain the desired mixing ratio of the hole transport layer 13. Similarly, the mixed region 14 was generated by coevaporation of pure NPB, pure Alq$_3$ and pure rubrene from separate sources with the evaporation rate of each being controlled from about 0.1 A/s to about 10 A/s to obtain the desired mixing ratio of the mixed region 14.

Following formation of the organic hole transport layer 13, the mixed region 14, and the electron transport region 15, the metal cathode 16 was deposited on the electron transport region 15 without breaking the vacuum.

A second organic light emitting device (device III-B) having a structure similar to the first organic light emitting device III-A, but which had a dual-layer hole transport region, was also fabricated and tested for comparison. In this second organic light emitting device, the dual-layer hole transport region contained (1) a buffer layer of CuPc, about 15 nanometers thick, contacting the anode, and (2) a hole transport layer of NPB, about 10 nanometers thick, laminated on the buffer layer and contacting the mixed region. This second organic light emitting device comprised an anode, a mixed region, an electron transport region, a cathode and a (SO) thermal protective element as illustrated above.

Changes (increase) in driving voltage of the first and second organic light emitting devices were tested under identical conditions with the devices being operated at a temperature of 90° C. in nitrogen gas under AC driving conditions at an average constant current density of 31.25 mA/cm$^2$. At this current density, the initial luminance of the first device (device III-A) and second device (III-B) was about 1,900 cd/m$^2$ and 1,750 cd/m$^2$ (candela per square meter), respectively, and the initial driving voltages of the two devices were 9 volts and 8.9 volts, respectively. Table III-1 shows the increase of driving voltage of the two devices as a percent of the initial driving voltage of each device after continuous operation for the shown periods of time at this temperature and current density.

TABLE III-1

| Time Elapsed | Percent Increase in Driving Voltage of Device III-A | Percent Increase in Driving Voltage of Device III-B |
| --- | --- | --- |
| 50 hours | Less than 1 percent | 4 percent |
| 100 hours | Less than 1 percent | 15 percent |
| 150 hours | 1 percent | 30 percent |
| 200 hours | 3 percent | 40 percent |
| 250 hours | 5 percent | 50 percent |

The results in the Table III-1 illustrate, for example, that device III-A demonstrates a higher driving voltage stability in the form of a much smaller voltage increase, even after operating for 250 hours at 90° C. at a current density of 31.25 mA/cm$^2$, compared to device III-B. Therefore, device III-A is believed to perhaps be more suitable for certain applications, which may select operating the organic light emitting devices at elevated temperatures over extended periods of time, and particularly when a higher stability of driving voltage is desired.

EXAMPLE IV

A first organic light emitting (hereafter referred to as device IV-A) device having a structure, such as device 10 in FIG. 1, was formed and evaluated. In this device, copper phthalocyanine (CuPc) N,N'-di(naphthalene-1-yl)-N,N'-diphenyl-benzidine (NPB), and tris(8-hydroxyquinoline) aluminum ($Alq_3$) were used as the porphyrin, hole transport material, and the electron transport material, respectively. The hole transport layer 13 was comprised of about 75 weight percent of CuPc and about 25 weight percent of NPB; and the mixed region 14 was comprised of about 49.8 weight percent of NPB, about 49.8 percent weight percent of $Alq_3$, and further comprised about 0.4 weight percent of rubrene fluorescent dopant as a luminescent material. The thickness of the hole transport layer 13 was about 25 nanometers; the thickness of the mixed region 14 was about 80 nanometers; and the thickness of the electron transport region 15 was about 20 nanometers. The hole transport layer 13, the mixed layer 14 and the electron transport region 15 were formed between an anode 12 comprised of indium-tin-oxide (ITO) having a thickness of about 200 nanometers, precoated on a glass substrate; and a cathode 16 comprised of a Mg:Ag (10:1 by weight) alloy having a thickness of about 120 nanometers. A thermal protective element comprised of silicon monoxide (SiO) and having a thickness of about 200 nanometers was coated on the cathode 16.

The organic light emitting device was fabricated using a vacuum evaporation process at a pressure of about $6\times10^{-6}$ torr. The hole transport layer 13 was produced by coevaporation of pure CuPc and pure NPB from separate sources with the evaporation rate of the individual sources controlled at about 3 A/s and 1 A/s to obtain the desired mixing ratio of the hole transport layer 13. Similarly, the mixed region 14 was generated by coevaporation of pure NPB, pure $Alq_3$ and pure rubrene from separate sources with the evaporation rate of each being controlled from about 0.1 A/s to about 10 A/s to obtain the desired mixing ratio of the mixed region 14.

Following formation of the organic hole transport layer 13, the mixed region 14, and the electron transport region 15, the metal cathode 16 was deposited on the electron transport region 15 without breaking the vacuum.

A second organic light emitting device (hereafter referred to as device IV-B) which was in all respects identical to device IV-A, but in which the hole transport layer 13 was comprised of about 50 weight percent of CuPc and about 50 weight percent of NPB was fabricated following exactly the same procedure for the preparation of device IV-A above.

A third organic light emitting device (hereafter referred to as device IV-C) which was in all respects identical to device IV-A, but in which the hole transport layer 13 was comprised of about 25 weight percent of CuPc and about 75 weight percent of NPB was fabricated following exactly the same procedure for the preparation of device IV-A above.

A fourth organic light emitting device (hereafter referred to as device IV-D) which was in all respects identical to device IV-A, but in which the hole transport layer 13 was comprised of CuPc, and did not comprise NPB, was fabricated following exactly the same procedure for device IV-A.

A fifth organic light emitting device (hereafter referred to as device IV-E) which was in all respects identical to device IV-A, but in which the hole transport layer 13 was comprised of NPB, and no CuPc was fabricated following exactly the same procedure for device IV-A.

The initial luminance at a current density of 31.25 $mA/cm^2$, initial driving voltage at this current density, and the increase in driving voltage after about 200 hours of operation at 90° C. at this current density are shown in Table IV-1.

TABLE IV-1

| Device | Initial Luminance at a Current of 31.25 $Ma/Cm^2$ | Initial Driving Voltage at a Current of 31.25 $Ma/Cm^2$ | Percent Increase in Driving Voltage After 200 Hours of Operation at 90° C. |
| --- | --- | --- | --- |
| IV-A | 1900 $cd/m^2$ | 9.0 Volts | 3 percent |
| IV-B | 1950 $cd/m^2$ | 8.8 Volts | 7 percent |
| IV-C | 2050 $cd/m^2$ | 8.5 Volts | 30 percent |
| IV-D | 1650 $cd/m^2$ | 8.5 Volts | 3 percent |
| IV-E | 1900 $cd/m^2$ | 7.7 Volts | >70 percent |

Increasing the porphyrin (CuPc) content and decreasing the hole transport layer (NPB) in the hole transport layer 13 of the organic light emitting device 10 can result in a slower (desirable) increase in the driving voltage of the organic light emitting device with a decrease (undesirable) in the device luminance (brightness).

Organic light emitting devices according to this invention can be used in various normal temperature condition technological applications. Furthermore, the high-temperature operational stability of the organic light emitting devices enables them to be used at high temperatures and in harsh conditions. For example, the devices can be used in various types of displays such as, for example, in automobiles and other types of vehicles, computer monitors, televisions and others like electronic devices and systems. Moreover, the devices can be used in harsh conditions such as in industrial applications where high temperatures are often present. The devices provide stable performance at high temperatures of at least, for example, about 50° C. or about 70° C. or even higher, for example about 100° C. for extended lifetimes, such as, at least about 1,000 hours. Thus, the organic light emitting devices according to this invention can be used in applications in which conventional bilayer devices would not be suitable.

Other embodiments and modifications of the present invention may occur to those skilled in the art subsequent to a review of the information presented herein; these embodiments and modifications, equivalents thereof, substantial equivalents thereof, or similar equivalents thereof are also included within the scope of this invention.

What is claimed is:

1. An organic light emitting device comprising
    (i) an anode;
    (ii) a hole transport layer comprising a mixture of a porphyrin and a hole transport material;
    (iii) a mixed region comprising a mixture of (1) a hole transport material, and (2) an electron transport material, and which mixed region optionally contains an organic luminescent material;
    (iv) a cathode, and wherein the organic light emitting device further comprises at least one of
    (v) an optional electron transport region interposed between the mixed region and the cathode; and
    (vi) an thermal protective element coated on one of the anode and cathode.

2. A device in accordance with claim 1 wherein at least one of said hole transport material (ii), and (iii) is selected from the group consisting of tertiary aromatic amines and indolocarbazoles; and wherein at least one of said electron transport material (iii), (v) is selected from the group consisting of metal oxinoids, stilbenes, triazines, and quinolines.

3. A device in accordance with claim 1 wherein said hole transport component comprising the mixed region are is the same or similar; and wherein there is selected an electron transport region, and wherein the electron transport component comprising the mixed region (iii) and the electron transport region (v) are the same or similar.

4. A device in accordance with claim 1 wherein there said hole transport component comprising the mixed region is different components; and wherein said electron transport component contained in the electron transport region and said electron transport component comprising the mixed region are different components.

5. A device in accordance with claim 1 wherein the porphyrin is a phthalocyanine.

6. A device in accordance with claim 1 wherein the porphyrin is the phthalocyanine copper phthalocyanine (CuPc).

7. A device in accordance with claim 6 wherein the hole transport layer (ii) comprises from about 25 weight percent to about 99 weight percent of CuPc, and from about 75 weight percent to about 1 weight percent of said hole transport component, and wherein the total thereof is about 100 percent.

8. A device in accordance with claim 6 wherein the hole transport layer (ii) comprises from about 50 weight percent to about 99 weight percent of CuPc, and from about 50 weight percent to about 1 weight percent of said bole transport component.

9. A device in accordance with claim 1 wherein said hole transport component of hole transport layer (ii) is selected from the group consisting of N,N'-di(naphthalene-1-yl)-N, N'-diphenyl-benzidine (NPB), N,N'-bis(p-biphenyl)-N,N'-diphenyl benzidine (biphenyl TPD), 5,11-di-naphthyl -5,11-dihydroindolo[3,2-b]carbazole and 2,8-dimethyl-5,11-di-naphthyl-5, 11-dihydroindolo[3,2-b]carbazole.

10. A device in accordance with claim 1 wherein the mixed region (iii) comprises from about 20 weight percent to about 80 weight percent of a hole transport component of a tertiary aromatic amine, and from about 80 weight percent to about 20 weight percent of an electron transport component of a metal oxinoid.

11. A device in accordance with claim 1 wherein the mixed region (iii) comprises from about 35 weight percent to about 65 weight percent of said hole transport component, and from about 65 weight percent to about 35 weight percent of said electron transport component.

12. A device in accordance with claim 1 wherein said hole transport component of (iii) is tertiary aromatic amine selected from the group consisting of N,N'-di(naphthalene-1-yl)-N,N'-diphenyl-benzidine (NPB) and N,N'-bis(p-biphenyl)-N,N'-diphenyl benzidine (biphenyl TPD), and said electron transporting component is a metal oxinoid elected from the group consisting of tris(8-hydroxyquinoline)aluminum (Alq$_3$) and bis(5-hydroxyquinolato)-(4-phenylphenolato)aluminum (Balq).

13. A device in accordance with claim 1 wherein the mixed region comprises from about 0.01 weight percent to about 10 weight percent of a fluorescent luminescent component.

14. A device in accordance with claim 13 wherein the fluorescent component is selected from the group consisting of coumarin, dicyanomethylene pyranes, polymethine, oxabenzanthrane, xanthene, pyrylium, carbostyl, perylene, acridone, quinacridone, rubrene, anthracene, coronene, phenanthrecene, pyrene, butadiene, stilbene, lanthanide metal chelate complexes, rare-earth metal chelate complexes, and 4-(dicyanomethylene)-2-1-propyl-6-(1,1,7,7-tetramethyljulolidyl-9-enyl)-4H-pyran.

15. A device in accordance with claim 13 wherein the fluorescent component is selected from the group consisting of rubrene, N,N'-dimethylquinacridone (DMQ), 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T), and (2-(1,1-dimethylethyl)-6-(2-(2,3,6,7-tetrahydro-1,1,7,7 -tetramethyl-1H, 5H-benzo(ij)quinolizin-9-yl)ethenyl)-4H-pyran-4-ylidene) propanedinitrile (DCJTB).

16. A device in accordance with claim 1 wherein the mixed region comprises from about 3 weight percent to about 30 weight percent of a phosphorescent luminescent component.

17. A device in accordance with claim 16 wherein the phosphorescent component is selected from the group consisting of 2,3,7,8,12,13,17,18-octaethyl-21H,23H-phorpine platinum(II) (PtOEP) and fac tris(2-phenylpyridine)iridium (Ir(ppy)$_3$).

18. A device in accordance with claim 1 wherein said electron transport region is present, and wherein said electron transport region comprises at least two layers.

19. A device in accordance with claim 18 wherein (1) a first layer of the electron transport region contacts the mixed region, and which first layer comprises a component selected from the group consisting of metal oxinoids and quinolines; and (2) the second layer of the electron transport region contacts the cathode, and which second layer comprises a component selected from the group consisting of metal oxinoids, phthalocyanines, and triazines.

20. A device in accordance with claim 19 wherein the first layer comprises a metal oxinoid of tris(8-hydroxyquinoline) aluminum (Alq$_3$) or bis(8-hydroxyquinolato)-(4-phenylphenolato)aluminum (Balq); or a quinoline of 1,4-bis (4-phenylquinolin-2-yl)benzene, or 4,4'-bis(4-phenylquinolin-2-yl)-1,1'-biphenyl (TA); and said second layer comprises a metal oxinoid of tris(8-hydroxyquinoline) aluminum (Alq$_3$) or bis(8 -hydroxyquinolato)-(4-phenylphenolato)aluminum (Balq); a phthalocyanine of copper phthalocyanine (CuPc); or a triazine of 4,4'-bis-[2-(4,6-diphenyl-1,3,5 -triazinyl)]-1,1'-biphenyl, 4,4'-bis-[2-(4,6-di-p-tolyl-1,3,5-triazinyl)1,1'-biphenyl, 4,4'-bis-(2-(4,6-di-m-tolyl-1,3,5-triazinyl)]-1,1'-biphenyl, 4,4'-bis-[2-(4,6-di-p -methoxyphenyl-1,3,5-triazinyl)]-1,1'-biphenyl, 4,4'-bis-[2-(4,6-di-m -methoxyphenyl-1,3,5-triazinyl)]-1,1'-biphenyl, or 2,4,6-tris(4-biphenylyl)-1,3,5 -triazine.

21. A device in accordance with claim 1 wherein there is at least one of (A) said anode comprising a layer of indium-tin-oxide, and (B) said cathode comprising a layer selected from the group consisting of (i) a layer comprised of Mg and Ag; (ii) a layer comprised of Al; (iii) a layer comprised of indium-tin-oxide; and (iv) a layer comprised of (1) an organic compound, (2) Mg, and (3) Ag.

22. A device in accordance with claim 21 wherein the cathode further comprises an alkaline metal or a compound thereof.

23. A device in accordance with claim 22 wherein the alkaline metal is selected from the group consisting of U, Na, K and Cs.

24. A device in accordance with claim 1 wherein there is present said thermal protective coating comprised of a layer of SiO, SiO$_2$ or mixtures thereof.

25. A device in accordance with claim 1 wherein the mixed region has a thickness of from about 5 nanometers to about 500 nanometers; the hole transport layer has a thickness of from about 5 nanometers to about 250 nanometers; and the electron transport region has a thickness of from about 5 nanometers to about 100 nanometers.

26. A device in accordance with claim 1 and comprising
an anode and a hole transport layer coated on the anode and comprised of from about 50 weight percent to about 99 weight percent of copper phthalocyanine (CuPc), and from about 50 weight percent to about 1 weight percent of a hole transport component selected from the group consisting of N,N'-di(naphthalene-1-yl)-N,N'-diphenyl-benzidine (NPB), N,N'-bis(p-biphenyl)-N, N'-diphenyl benzidine (biphenyl TPD), 5,11-di-naphthyl -5,11-dihydroindolo[3,2-b]carbazole, and 2,8-dimethyl-5,11-di-naphthyl-5,11-dihydroindolo[3,2-b]carbazole, and which region has a thickness of from about 5 nanometers to about 100 nanometers;
mixed region situated on the hole transport region comprised of from about 35 weight percent to about 65 weight percent of N,N'-di(naphthalene-1-yl)-N,N'-diphenyl-benzidine (NPB) or N,N'-bis(p -biphenyl)-N, N'-diphenyl benzidine (biphenyl TPD), and from about 65 weight percent to about 35 weight percent of tris (8-hydroxyquinoline)aluminum or bis(8-hydroxyquinolato)-(4-phenylphenolato)aluminum, wherein all weight percents are based on the total weight of components comprising the mixed region, and wherein the thickness of the mixed region is from about 20 nanometers to about 200 nanometers;
an electron transport region situated on the mixed region comprised of tris(8-hydroxyquinoline)aluminum ($Alq_3$) or bis(8 -hydroxyquinolato)-(4-phenylphenolato)aluminum (Balq), wherein the thickness of the electron transport region is from about 5 nanometers to about 50 nanometers; and
a cathode situated on the electron transport region.

27. A device in accordance with claim 26 wherein the mixed region further contains one of
about 0.2 weight percent to about 2 weight percent of a luminescent component selected from the group consisting of rubrene, N,N'-dimethylquinacridone (DMQ), and 10-2-(benzothiazolyl)-2,3,6,7 -tetrahydro-1,1,7,7-tetramethyl-1H, 5H, 11H-(1)benzopyropyrano (6,7,-8-ij) quinolizin-11-one (C545T);
about 0.2 weight percent to about 5 weight percent of (2-(1,1-dimethylethyl)-6-(2-(2,3,6,7-tetrahydro-1,1,7,7-tetramethyl-1H,5H -benzo (ij)quinolizin-9-yl) ethenyl)-4H-pyran-4-ylidene)propanedinitrile (DCJTB); and
about 5 weight percent to about 15 weight percent of 2,3,7,8,12,13,17,18-octaethyl-21H,23H-phorpine platinum(II) (PtOEP), wherein all weight percents are based on the total weight of components comprising the mixed region.

28. A device in accordance with claim 1 and comprising
an anode of indium-tin-oxide with a thickness of from about 30 to about 300 nanometers, and which anode is present on a substrate, the anode and the substrate being capable of transmitting at least about 70 percent of radiation of wavelength of from about 400 nanometers to about 750 nanometers;
a hole transport layer situated on and in contact with the anode, and which layer is comprised of from about 50 weight percent to about 99 weight percent of copper phthalocyanine (CuPc), and from about 50 weight percent to about 1 weight percent of a hole transport component selected from the group consisting of N,N'-di(naphthalene-1-yl)-N,N'-diphenyl -benzidine (NPB), N,N'-bis(p-biphenyl)-N,N-diphenyl benzidine (biphenyl TPD), 5,11-di-naphthyl-5,11-dihydroindolo [3,2-b]carbazole, and 2,8-dimethyl-5,11-di -naphthyl-5,11-dihydroindolo[3,2-b]carbazole, and which region has a thickness of from about 5 nanometers to about 100 nanometers;
a mixed region situated on the hole transport region comprised of from about 35 weight percent to about 65 weight percent of N,N'-di(naphthalene-1-yl)-N,N'-diphenyl-benzidine (NPB) or N,N'-bis(p -biphenyl)-N, N'-diphenyl benzidine (biphenyl TPD), and from about 65 weight percent to about 35 weight percent of tris (8-hydroxyquinoline) aluminum or bis(8-hydroxyquinolato)-(4-phenylphenolato)aluminum wherein all weight percents are based on the total weight of components comprising the mixed region, and wherein the thickness of the mixed region is from about 20 nanometers to about 200 nanometers;
an electron transport region situated on the mixed region comprised of tris(8-hydroxyquinoline)aluminum ($Alq_3$) or bs(8 -hydroxyquinolato)-(4-phenylphenolato) aluminum (Balq) wherein the thickness of the electron transport region is from about 5 nanometers to about 50 nanometers;
a cathode situated on the electron transport region comprised of one of (1) a first layer comprised of Mg:Ag alloy or Al of a thickness of from about 50 nanometers to about 500 nanometers; and or (2) a first layer comprised of from about 40 volume percent to about 55 volume percent of Mg; from about 2 volume percent to about 10 volume percent of Ag; and from about 55 volume percent to about 40 volume percent of $Alq_3$ wherein the thickness of the first layer is from about 100 nanometers to about 600 nanometers, and coated with a second layer of thickness of from about 50 nanometers to about 500 nanometers comprising a metal or a metal alloy; and
a thermal protective layer, and which layer is comprised of SiO, $SiO_2$ or mixtures thereof of a thickness of from about 100 nanometers to about 1,000 nanometers.

29. A device in accordance with claim 28 wherein the mixed region further comprises one of
about 0.2 weight percent to about 2 weight percent of a luminescent component selected from the group consisting of rubrene, N,N'-dimethylquinacridone (DMQ), and 10-2-(benzothiazolyl)-2,3,6,7 -tetrahydro-1,1,7,7-tetramethyl-1H, 5H, 11H-(1)benzopyropyrano (6,7,-8-ij) quinolizin-11-one (C545T);
about 0.2 weight percent to about 5 weight percent of (2-(1,1-dimethylethyl)-6-(2-(2,3,6,7-tetrahydro-1,1,7, 7-tetramethyl-1H,5H -benzo(ij)quinolizin-9-yl) ethenyl)-4H-pyran-4-ylidene)propanedinitrile (DCJTB); and
about 5 weight percent to about 15 weight percent of 2,3,7,8,12,13,17,18-octaethyl-21H,23H-phorpine platinum(II) (PtOEP) wherein all weight percents are based on the total weight of components comprising the mixed region.

30. A device in accordance with claim 1 wherein
said anode is indium-tin-oxide with a thickness of from about 30 to about 300 nanometers, and which anode is coated on a substrate;

the hole transport layer is situated on the anode, and which layer is comprised of from about 50 weight percent to about 99 weight percent of copper phthalocyanine (CuPc), and from about 50 weight percent to about 1 weight percent of a hole transport component selected from the group consisting of N,N'-di(naphthalene-1-yl)-N,N'-diphenyl -benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di -naphthyl-5,11-dihydroindolo[3,2-b]carbazole, and which layer has a thickness of from about 5 nanometers to about 100 nanometers;

a mixed region situated on the hole transport region comprised of from about 35 weight percent to about 65 weight percent of N,N'-di(naphthalene-1-yl)-N,N'-diphenyl-benzidine (NPB) or N, N'-bis(p -biphenyl)-N,N'-diphenyl benzidine (biphenyl TPD), and from about 65 weight percent to about 35 weight percent of tris(8-hydroxyquinoline) aluminum or bis(8-hydroxyquinolato)-(4-phenylphenolato)aluminum wherein all weight percents are based on the total weight of components comprising the mixed region, and wherein the thickness of the mixed region is from about 20 nanometers to about 200 nanometers;

an electron transport region situated on the mixed region comprising (1) a first layer of thickness of from about 5 nanometers to about 25 nanometers contacting the mixed region, and wherein this first layer is comprised of tris(8-hydroxyquinoline)aluminum (Alq$_3$), bis(8-hydroxyquinolato)-(4-phenylphenolato)aluminum (Balq), or 1,4-bis(4 -phenylquinolin-2-yl)benzene, 4,4'-bis(4-phenylquinolin-2-yl)-1,1'-biphenyl (TA); and (2) a second layer of a thickness of from about 5 nanometers to about 25 nanometers contacting the cathode, and wherein the second layer is comprised of tris(8-hydroxyquinoline)aluminum (Alq$_3$), bis(8-hydroxyquinolato) -(4-phenylphenolato)aluminum (Balq), copper phthalocyanine (CuPc), 4,4'-bis -[2-(4,6-diphenyl-1,3,5-triazinyl)]-1,1'-biphenyl, 4,4'-bis-[2-(4,6-di-p-tolyl-1,3,5 -triazinyl)]-1,1'-biphenyl, 4,4'-bis-[2-(4,6-di-m-tolyl-1,3,5-triazinyl)]-1,1'-biphenyl, 4,4'v-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4 -biphenylyl)-1,3,5-triazine;

a cathode situated on the electron transport region comprised of one of (1) a first layer comprised of Mg:Ag alloy or Al of a thickness of from about 50 nanometers to about 500 nanometers: or (2) a first layer comprised of from about 40 volume percent to about 55 volume percent of Mg; from about 2 volume percent to about 10 volume percent of Ag and from about 55 volume percent to about 40 volume percent of Alq$_3$ wherein the thickness of the first layer is from about 100 nanometers to about 600 nanometers; and coated with a second layer of a thickness of from about 50 nanometers to about 500 nanometers comprising a metal or a metal alloy; and a thermal protective layer situated on the cathode comprised of SiO, SiO$_2$ or mixtures thereof, and which cathode is of a thickness of from about 100 nanometers to about 1,000 nanometers.

31. A device in accordance with claim 30 wherein the mixed region further comprises one of about 0.2 weight percent to about 2 weight percent of a luminescent component selected from the group consisting of rubrene, N,N'-dimethylquinacridone (DMQ), and 10-2-(benzothiazolyl)-2,3,6,7 -tetrahydro-1,1,7,7-tetramethyl-1H, 5H, 11H-(1)benzopyropyrano (6,7,8-ij) quinolizin-11-one (C545T);

about 0.2 weight percent to about 5 weight percent of (2-(1,1-dimethylethyl)-6-(2-(2,3,6,7-tetrahydro-1,1,7,7-tetramethyl-1H,5H -benzo (ij)quinolizin-9-yl)ethenyl)-4H-pyran-4-ylidene)propanedinitrile (DCJTB); and about 5 weight percent to about 15 weight percent of 2,3,7,8,12,13,17,18-octaethyl-21H,23H-phorpine platinum(II) (PtOEP), wherein all weight percents are based on the total weight of components comprising the mixed region.

32. A display comprising at least one organic light emitting device of claim 1.

33. A device in accordance with claim 1 wherein said mixed region is capable of emitting tight in response to hole electron recombination.

34. A device in accordance with claim 1 wherein each of said region contains from about 1 to about 7 layers.

35. A device in accordance with claim 1 wherein each of said region contains from about 2 to about 4 layers.

36. A device in accordance with claim 1 wherein said hole transport component, or said electron transport component of (iii) additionally functions as a luminescent material.

37. A device in accordance with claim 1 further including a luminescent material in (iii).

38. A device in accordance with claim 37 wherein the device further contains a protective layer of a silicon oxide, silicon dioxide or mixtures thereof, and wherein (v), (vi) or both (v) and (vi) are present.

39. A device in accordance with claim 1 wherein the porphyrin is a copper phthalocyanine and said (v), (vi) or both (v) and (vi) are present.

40. A device comprised of (i) an anode;

(ii) a hole transport layer comprising a mixture of a porphyrin and a hole transport material;

(iii) a mixed region comprising a mixture of (1) a hole transport material, and (2) an electron transport material, and which mixed region optionally contains an organic luminescent material; (iv) a cathode, and wherein the organic light emitting device optionally further comprises at least one of (v) an electron transport region interposed between the mixed region and the cathode; and (vi) an thermal protective element coated on one of the anode and cathode.

41. An organic light emitting device comprising (i) an anode;

(ii) a hole transport layer comprising a mixture of a porphyrin and a hole transport material;

(iii) a mixed region comprising a mixture of (1) a hole transport material, and (2) an electron transport material, and which mixed region contains an organic luminescent material;

(iv) a cathode, and wherein the organic light emitting device further comprises at least one of (V) an electron transport region interposed between the mixed region and the cathode; and (vi) an thermal protective element coated on one of the anode and cathode.

42. A device in accordance with claim 41 wherein the porphyrin is a phthalocyanine.

43. A device in accordance with claim 42 wherein the porphyrin is a copper phthalocyanine.

* * * * *